United States Patent [19]

Chiang et al.

[11] Patent Number: 5,565,792

[45] Date of Patent: *Oct. 15, 1996

[54] MACROCELL WITH PRODUCT-TERM CASCADE AND IMPROVED FLIP FLOP UTILIZATION

[75] Inventors: David Chiang, Saratoga; Napoleon W. Lee, Fremont; Thomas Y. Ho, Milpitas; David A. Harrison, Cupertino; Nicholas Kucharewski, Jr., Pleasanton; Jeffrey H. Seltzer, San Jose, all of Calif.

[73] Assignee: Xilinx, Inc., San Jose, Calif.

[*] Notice: The term of this patent shall not extend beyond the expiration date of Pat. No. 5,357,153.

[21] Appl. No.: 301,504

[22] Filed: Sep. 6, 1994

Related U.S. Application Data

[62] Division of Ser. No. 10,378, Jan. 28, 1993, Pat. No. 5,357,153.

[51] Int. Cl.⁶ .................................................. H03K 19/177
[52] U.S. Cl. ............................. 326/40; 326/39; 327/407
[58] Field of Search ........................... 326/38, 39, 40, 326/41, 46, 47, 93; 327/407

[56] References Cited

U.S. PATENT DOCUMENTS

| | | | |
|---|---|---|---|
| 4,758,746 | 7/1988 | Birkner et al. | 326/40 |
| 4,771,285 | 9/1988 | Agrawal et al. | 340/307 |
| 4,912,345 | 3/1990 | Steele et al. | 307/465 |
| 4,933,577 | 6/1990 | Wong et al. | 307/465 |
| 4,963,770 | 10/1990 | Keida | 326/40 |
| 5,027,011 | 6/1991 | Steele | 307/465 |
| 5,027,315 | 6/1991 | Agrawal et al. | 364/900 |
| 5,121,006 | 6/1992 | Pedersen | 326/38 |
| 5,122,685 | 6/1992 | Chan et al. | 326/40 |
| 5,136,188 | 8/1992 | Ha et al. | 307/465 |
| 5,260,611 | 11/1993 | Cliff et al. | 326/39 |

OTHER PUBLICATIONS

Weste et al.; "Principles of CMOS VLSI Design, A Systems Perspective"; ©1985 by AT&T Bell Laboratories, Inc. and Kamran Eshraghian; pp. 182–183.

Advanced Micro Devices "MACH™ Family Data Book, High Density EE CMOS Programmable Logic, Q2 1991 Data Book", Copyright 1991 Advanced Micro Devices, Inc.

*Primary Examiner*—Edward P. Westin
*Assistant Examiner*—Benjamin D. Driscoll
*Attorney, Agent, or Firm*—Norman R. Klivans; Edel M. Young

[57] ABSTRACT

A programmable logic device having macrocells enables gate cascades between macrocells to occur with a faster signal transit time, while preserving the flip flop function of the cascaded macrocells by reallocating a redirectable flip flop reset product term to the flip flop input. All gate product terms are retained during cascading. The macrocell logic is optimized for fast signal transit with selectable flip flop clocking. Multiplex clocking and programming are done with fewer transistors in the signal path, further reducing signal transit time.

7 Claims, 6 Drawing Sheets

MACROCELL WITH PRODUCT-TERM CASCADE AND IMPROVED FLIP FLOP UTILIZATION

This application is a division of application Ser. No. 08/010,378, filed Jan. 28, 1993, now abandoned.

BACKGROUND OF THE INVENTION

This invention relates to the implementation of custom logic functions in an integrated circuit logic device and more specifically to cascading of product terms.

DESCRIPTION OF THE PRIOR ART

There is a need for flexibility and speed in integrated circuit design. In response, a class of integrated circuits (I.C.'s) known as Programmable Logic Devices (PLDs) was developed. PLDs enable the designer to custom program arbitrary logical functions in an I.C. chip, according relative ease and flexibility in testing prototypes and making design changes.

Xilinx, Inc. the assignee of the present invention, manufactures PLDs, the architecture of which is shown in FIG. 1 including an array of configurable logic blocks 1, 2, 3, 4 interconnected via a universal interconnect matrix (UIM) 5. The input lines 6 into logic block 1 are programmably combined into a number of AND gates 7 in the AND array 8. The output lines 9 provide product terms. Product terms 9 of each AND gate 7 of the AND array 8 are provided to one of a series of macrocells 10 in each logic block.

Architecture of a typical macrocell 10 is shown in FIG. 2. Macrocell 10 configures the outputs of AND array 8 of FIG. 1 and may perform additional logic on the output signals of AND array 8. Macrocell 10 contains an OR gate 11 into which product terms are gated, and a flip flop 12 for storing the output signal of OR gate 11. Output line 13 of OR gate 11 and the output lines 13a and 13b of flip flop 12 can be configured programmably by setting the multiplexers (MUXs) 14, 15 and 16 with configuration bits on their control terminals, each specifying the output state of the respective MUX.

The macrocell of FIG. 2 advantageously provides a relatively large count (eight) of product terms 11.1 per macrocell, but is inefficient in macrocell usage. The disadvantage is that a fixed product term count is not flexible enough to handle the product term count variability that arises. User product term requirements for a logic function can vary widely, anywhere from one to sixteen product terms or more, depending on the complexity of the logic function. Single product term functions are quite common. For logic functions requiring less than eight product terms in the macrocell of FIG. 2, the unused product terms are wasted. For functions requiring more than eight product terms, the function must be split up into two or more subfunctions, each of which can be implemented with the available eight product terms of a macrocell. The results of the subfunction operations must make additional passes through the AND array to be recombined in other macrocells, thus incurring a significant time delay in the execution of complex logic functions.

For design of complex integrated circuitry, a more flexible macrocell architecture is needed. More recent PLDs feature macrocells with the ability to direct their OR gate or product term outputs into adjacent macrocell OR gate inputs, a feature known as cascading. Cascading enables product terms normally associated with one macrocell to instead be logically combined into the OR gate of another macrocell. This process is known as product term expansion.

Xilinx, Inc., the assignee of the present invention, manufactures a PLD incorporating macrocells which can "share" up to twelve product terms by having a set of twelve undedicated "shared" product terms which may be used by any macrocell within the same logic block. Each macrocell also has four private product terms which can be steered by statically controlled multiplexers to functions within the macrocell. Hence, a macrocell can be fed by anywhere from one to sixteen product terms. However, logic that requires more than sixteen product terms must be performed with two or more passes through macrocell logic, adding an associated time delay with each pass.

Advanced Micro Devices, Inc. manufactures a PLD incorporating macrocells which allow product term expansion without additional passes through macrocell logic as disclosed in AMD's MACH™ Family Data Book. The MACH™ macrocell works by "stealing" all the product terms of one or more neighboring macrocells, for up to 3 neighbors for a total of up to 16 product terms. However, it is also limited to 16 product terms, and the flip flop and output driver associated with a macrocell whose product terms are stolen are thereby rendered useless.

FIG. 3 shows a macrocell 17 disclosed in Pedersen U.S. Pat. No. 5,121,006. The macrocell of FIG. 3 also "steals" product terms of neighboring macrocells, but has extra logic which "reclaims" (makes available) the flip flop in the macrocell for which the product terms have been stolen. In macrocell 17, cascading is accomplished by programmable MUX 18. Setting the configuration bit (to value 1) of MUX 18 directs the output line 19 of OR gate 20 into OR gate 21 of an adjacent macrocell 22. OR gate 33 from adjacent macrocell 34 is shown cascaded into OR gate 20 of macrocell 17. By cascading a series of macrocells in this way, an arbitrary number of product terms can be gated together as needed.

In FIG. 3, macrocell 17 prevents loss of availability of the flip flop by "stealing" one or more product terms from the OR gate 20 input for this purpose by means of switches 23, 24, 25, 26, 27 and the MUXs 28, 29, 30, 31. This is accomplished by programmably setting a switch 23, 24, 25, 26, 27 to divert the associated product term from an OR input line so that a downstream MUX 28, 29, 30, 31 can allocate the product term to a flip flop 32.

The circuit of Pedersen undesirably increases complexity and so compromises speed. Pedersen utilizes switches 23, 24, 25, 26, 27 to direct product terms from the OR gate for use in reclaiming the flip flop; switches 23, 24 25, 26, 27 degrade the performance by adding unnecessary delays in signal transit time, regardless of the switch settings, thereby slowing down the configured logic function. Additional logic in the Pedersen macrocell (i.e. elements 35, 36) also delay signal transit times. Pedersen's flip flop 32 can be made transparent (bypassed) by means of multiplexer 37.

SUMMARY OF THE INVENTION

In accordance with the present invention a PLD has a macrocell for implementing cascades with a faster signal transit time, while preserving use of the flip flop and associated output driver of the cascaded macrocell by reallocating a dedicated product term normally used for flip flop reset. The macrocell can be selectively clocked according to any one of a plurality of clock input signals, to provide flexibility at the macrocell level.

BRIEF DESCRIPTION OF THE DRAWINGS

FIG. 7b is a diagram of a circuit to produce a composite signal for the circuit of FIG. 7a.

DETAILED DESCRIPTION OF THE INVENTION

Figure 1:
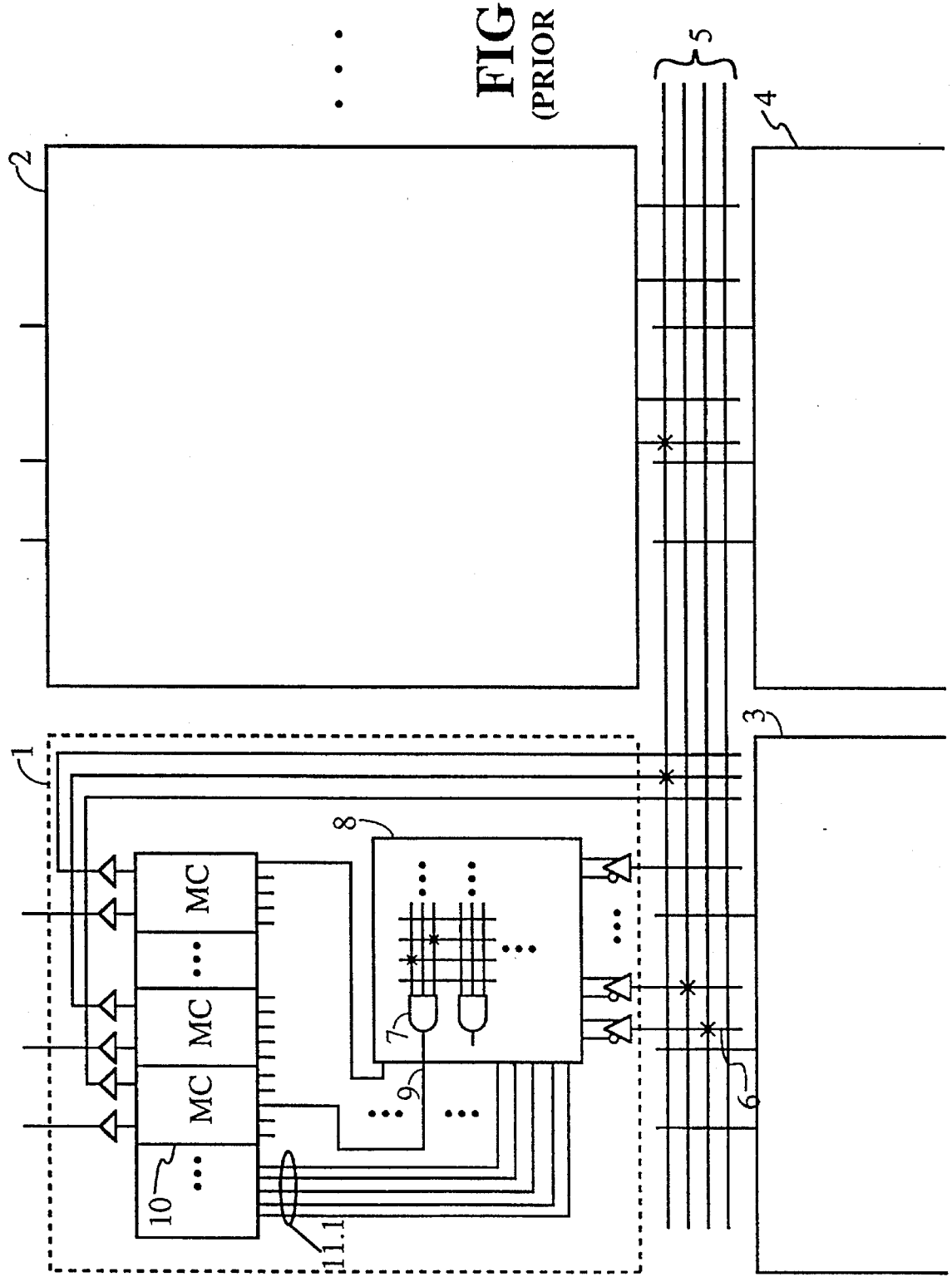
FIG. 1 is a block diagram of prior art PLD architecture.
Figure 2:
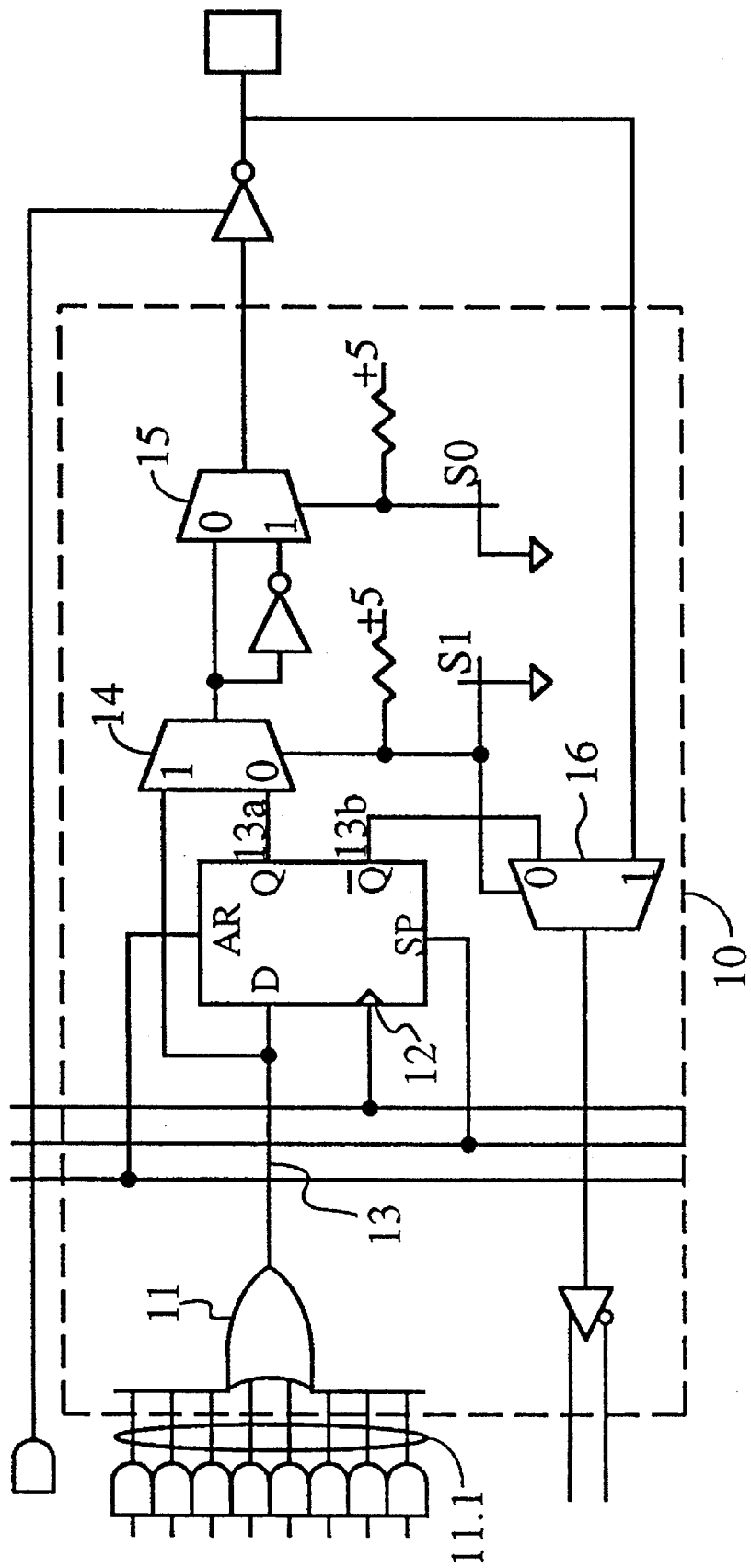
FIG. 2 is a schematic diagram of a prior art macrocell circuit.

In accordance with the present invention a new macrocell provides fast product term cascade and allocation. As shown in the macrocell 40 of FIG. 4, a 5-input OR gate 41 is fed by product term signal lines 43, 44, 45, 46 from a conventional AND array (not shown) and from OR gate 54 of adjacent macrocell 55 via MUX 56. Product term signal line 42 is a dedicated line from the AND array which can be configured to provide a reset input to the flip flop 47 by programming multiplexer 57 using a cascade configuration bit CB1.

OR gate output line 49 is connected by line 50 to the terminal 1 of programmable multiplexer 51, whose output line DOUT cascades into an input terminal of the OR gate 52 of an adjacent macrocell 53. The cascade signal from the OR gate 54 of adjacent macrocell 55 can be input into the OR gate 41 on the line DIN by programming a multiplexer 56 associated with the adjacent macrocell 55 using configuration bit CB3.

The input product term line 42 is used as a dedicated reset line for the flip flop (D-type flip flop) 47 when the macrocell 40 is in the non-cascade mode (i.e., cascade configuration bit CB1 is not set). The input product line 42 connects, respectively, to input terminals 0 and 1 of multiplexers 57 and 48. Multiplexer 57 directs the signal on input product term line 42 to the reset (R) input terminal of flip flop 47 when the cascade configuration bit CB1 is not set (has value 0). When the cascade configuration bit CB1 is set (to value 1), indicating a cascade mode for the macrocell 40, the multiplexer 57 will give the flip flop 47 reset input line 58 a static low signal. The various configuration bits CB1, CB2, CB3 are set conventionally via fuses, antifuses, memory cells, EPROMs, EEPROMs, or the like.

When the cascade control bit CB1 is not set (i.e., non-cascade mode), multiplexer 48 directs the signal from the OR gate output line 49 to the D input of flip flop 47. When the cascade control bit CB1 is set to implement cascading, multiplexer 48 redirects the signal from product term line 42 to the D input of flip flop 47 to provide the flip flop data signal and therefore preserve the use of flip flop 47.

In accordance with one embodiment, the three programmable multiplexers 48, 51 and 57 are controlled by one configuration bit CB1. In other embodiments, these multiplexers are independently controlled by separate configuration bits. Of course, when a multiplexer receives a constant input signal, as provided in multiplexers 51 and 57 of FIG. 4, it can be implemented by a logical equivalent such as a 2-input AND gate.

Setting the cascade bit CB1 causes multiplexer 51 to direct the output signal of OR gate 49 along the DOUT line which connects to the input line of OR gate 52 in adjacent macrocell 53. Thus, the effect of setting the cascade configuration bit CB1 is to enable the OR gate cascade feature and reclaim flip flop 47 with the dedicated product term signal of line 42. Although the cascade mode sacrifices the reset capability of the flip flop 47, a known value is entered in the flip flop when the device is first powered up, enabling the user to load the flip flop in the cascade mode by a signal on the product term line 42. There is provided a conventional circuit (not shown) that forces either a set or a reset into the flip flop during one cycle of the configuration loading sequence upon power up.

Figure 4:
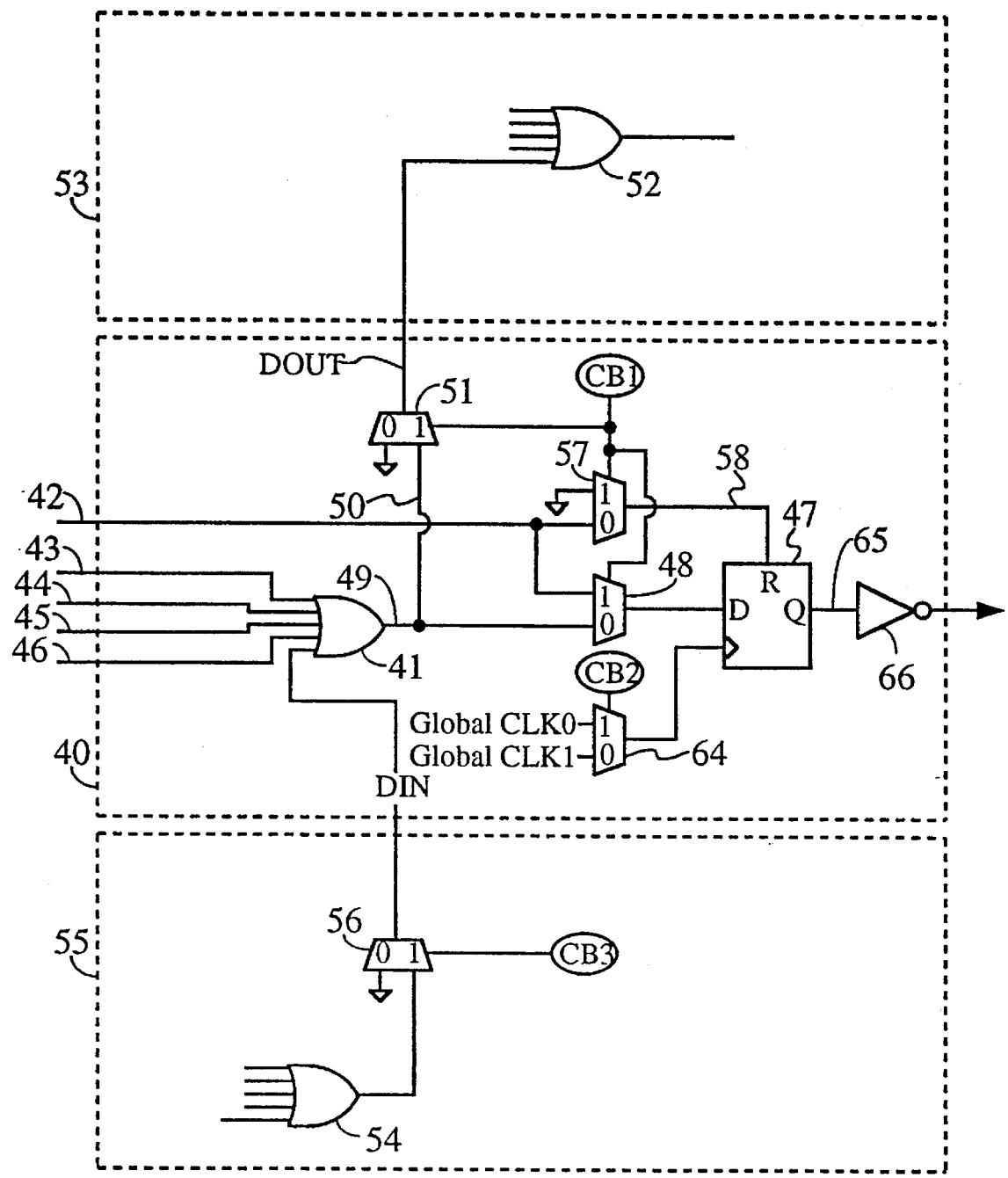
FIG. 4 is a schematic diagram of one embodiment of the present invention.
Figure 5:
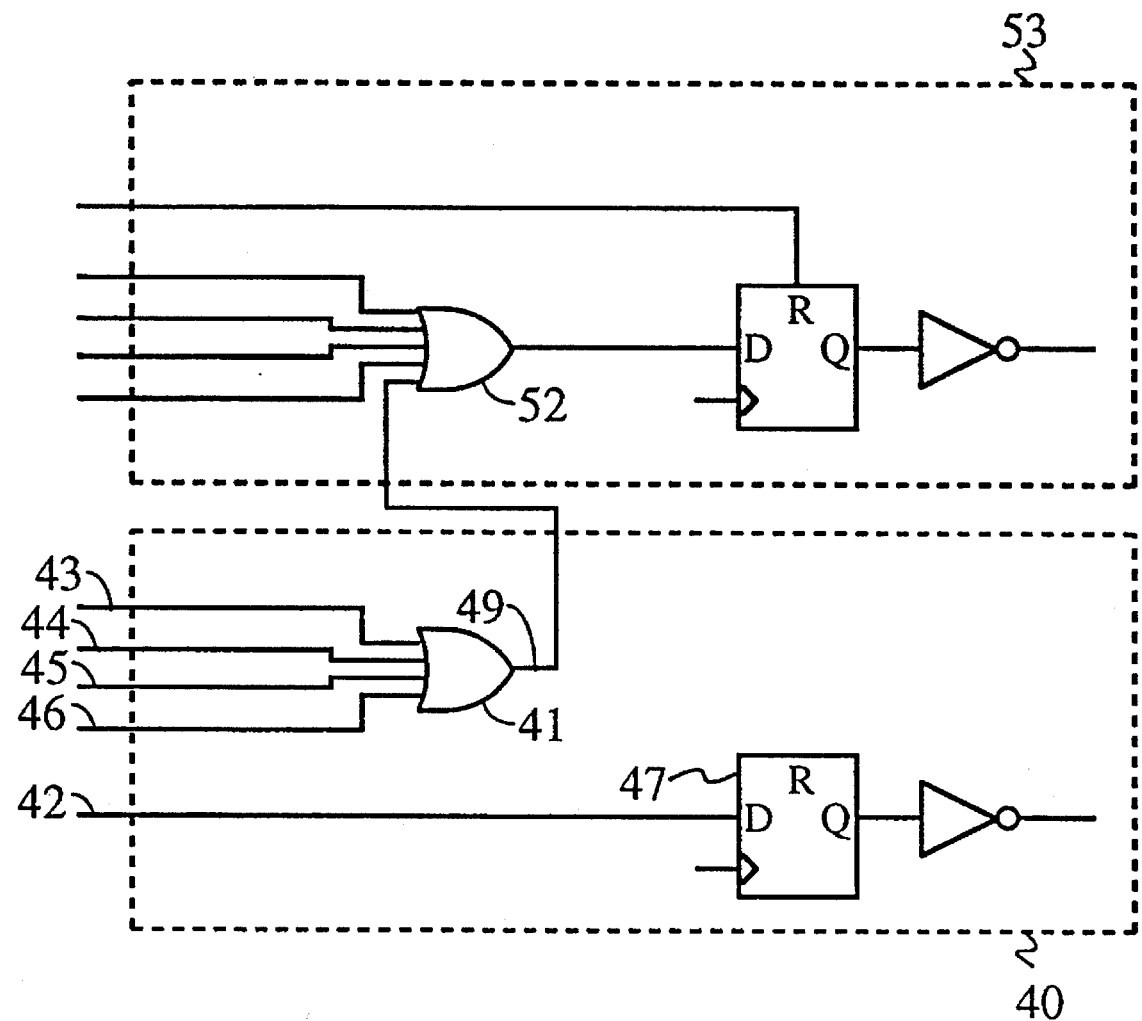
FIG. 5 is a schematic diagram illustrating the effect of cascading the macrocell according to the embodiment of FIG. 4.

The effect of setting the cascade bit CB1 on the macrocell 40 of FIG. 4 is shown in the equivalent circuit of FIG. 5. The OR gate output line 49 of the cascaded macrocell 40 (macrocell 40 for which the cascade bit CB1 is set) is cascaded into the OR gate 52 of an adjacent macrocell 53 by means of multiplexer 51 of FIG. 4. Signals on dedicated product term line 42 are directed from the flip flop reset input by multiplexers 48 and 57 of FIG. 4, providing a data signal to the flip flop D input. Thus, as shown in FIG. 5, the effect of cascading reclaims the flip flop 47 without "stealing" an OR gate product term signal from lines 43, 44, 45, 46.

By multiple cascading through adjacent macrocells, this macrocell enables an arbitrary number of product terms to be logically combined, thus providing the user with the ability to program logical functions of arbitrary complexity. In some embodiments, the cascading circuitry may provide that either of two connected macrocells may be configured to be downstream of the other. Such embodiments are not shown in a figure. One additional input per OR gate gives this option.

Figure 3:
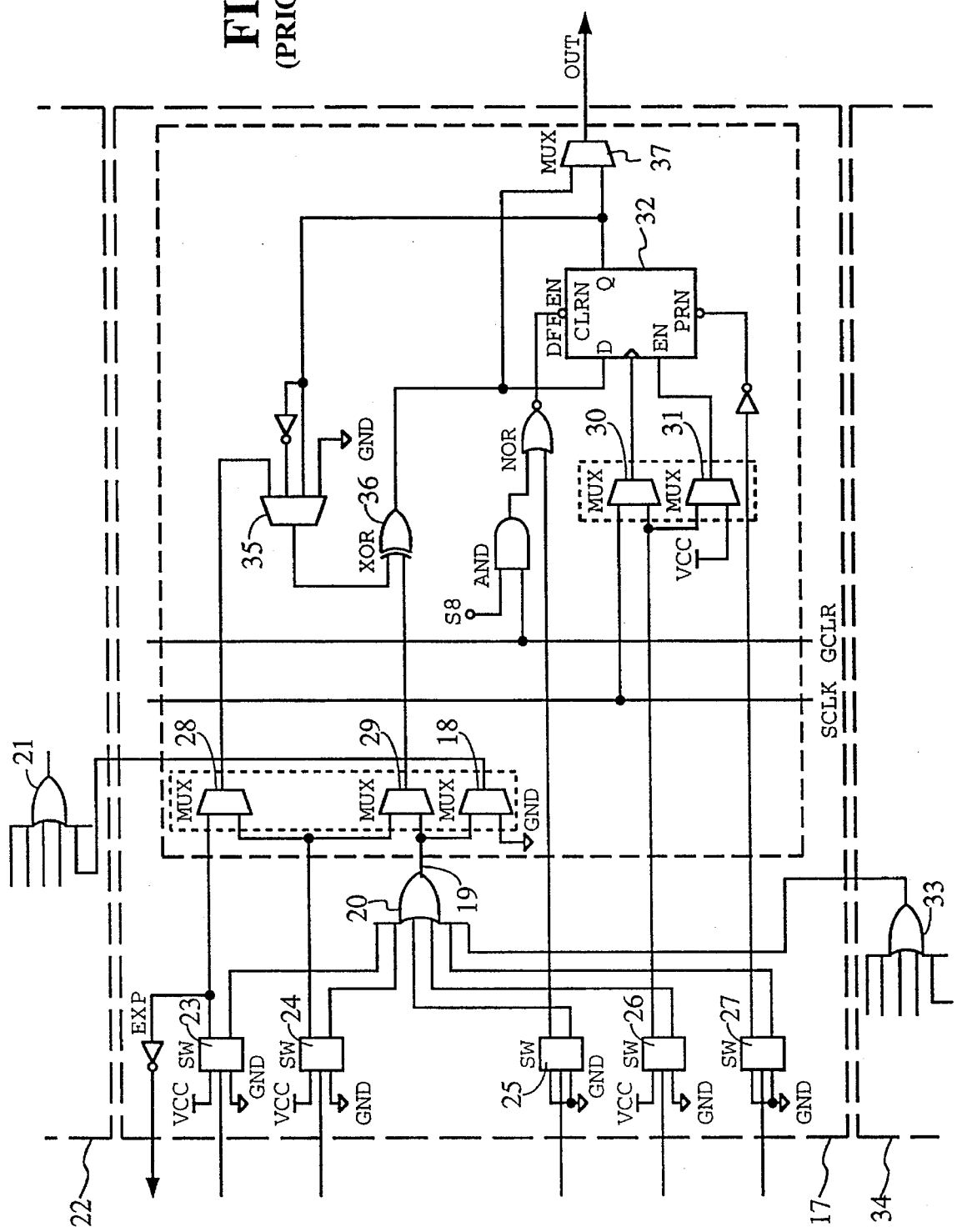
FIG. 3 is a schematic diagram of another prior art macrocell circuit.

In another feature (see FIG. 4), multiplexer 64 selects between two external clock input signals Global CLK0 and Global CLK1 to clock the flip flop 47. Multiplexer 64 is controlled by the clock select control bit CB2. The embodiment of FIG. 4 shows a choice of two global clock signals. In another embodiment one clock signal can be derived from a product term output signal as was done in FIG. 3. Implementing clock selection at the flip flop eliminates the delay incurred by including multiplexers 30 or other circuit elements in the speed path of product terms, as in the prior art FIG. 3 macrocell.

In one embodiment, the output signal Q of the flip flop 47 on line 65 is inverted by a conventional inverter 66. The inverted output signal from inverter 66 is then directed to a conventional chip pad output circuit (not shown) and the universal interconnect matrix (UIM, not shown here, see 5 in FIG. 1). In another embodiment, the inverted output signal Q is used as the chip pad output signal. Inversion of the output signal allows fast active-low signals to be generated. This is consistent with many signals on other devices such as chip enables that tend to be active-low.

Figure 6:
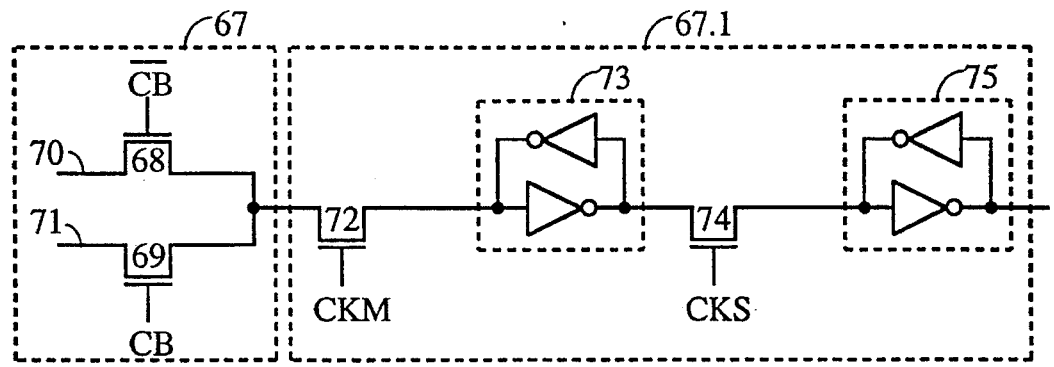
FIG. 6 is a circuit diagram of a prior art multiplexer and flip flop.

At the transistor level, signal transit time is decreased further by novel multiplexer and flip flop circuits. FIG. 6 is a circuit diagram of a prior art multiplexer 67 and associated flip flop 67.1. The control bit CB (inverted and non-inverted respectively) controls the gates of two transistors 68 and 69, thereby selecting among two input lines 70 and 71. Transistor 72 is controlled by a master latch clock signal CKM allowing the selected signal to be stored by master latch 73. Slave clock signal CKS, controlling the gate of transistor 74, allows the stored signal to pass through to the slave latch 75.

Figure 7A:
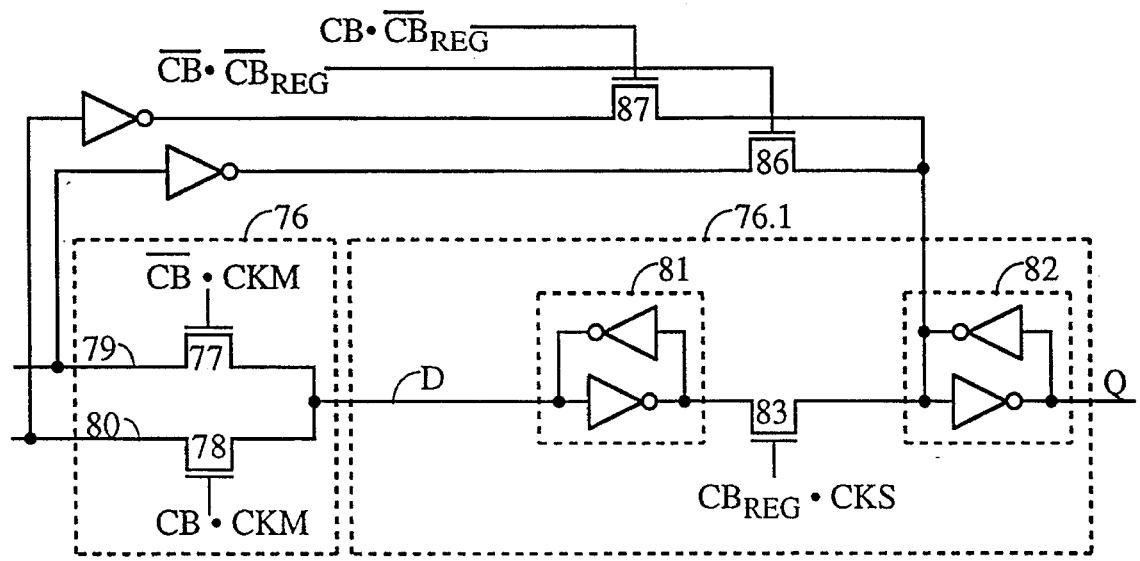
FIG. 7a is a circuit diagram of a multiplexer in one embodiment of the present invention.
Figure 7B:
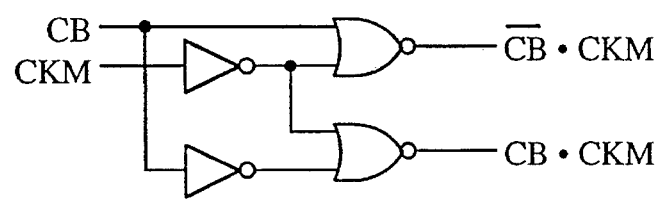

A novel multiplexer and flip flop in accordance with one embodiment of the present invention is shown in FIG. 7a with most elements identical to the corresponding elements of FIG. 6. The multiplexer 76 is used for multiplexers 48, 51, 57, 64 in FIG. 4. The flip flop 76.1 is used for the flip flop 47 of FIG. 4. In the multiplexer 76 composite signals CB•CKM and CB•CKM, formed, for instance, by the logic circuit of FIG. 7b using two NOR gates, (where • denotes the logical AND operation) control the gates of two transistors 77 and 78, selecting between the two input lines 79 and 80. Latches 81, 82 and pass gate transistor 83 are identical to the corresponding elements (respectively 73, 75 and 74) of the prior art circuit of FIG. 6. Conventionally, the flip flop clock signal is used to generate a clock signal CKM for the master latch 81 and a clock signal CKS for the slave latch 82. By using the composite signals CB•CKM and CB•CKM to control the gates of transistors 77 and 78, multiplexer 76 achieves the same function as does the prior art multiplexer 67 of FIG. 6 with reduced signal transit time, by eliminating from the signal path the pass gate transistor 72 of FIG. 6. In the embodiment of FIG. 4, static configuration bit CB of FIG. 7b is the cascade control bit CB1.

Flip flop 47 of FIG. 4 (identical to flip flop 76.1 of FIG. 7a) may be put into transparent mode by bypassing the master latch of flip flop 47 with a passgate. In transparent mode the flip flop simply passes the D input signal along as an output without storing it. As shown in FIG. 7a, to implement the transparent mode, either transistor 86 or transistor 87 is turned on when configuration bit $CBR_{REG}$ is not set. Thus configuration bit $CB_{REG}$ when set to "0" prevents the signal from master latch 81 from passing to slave latch 82 when slave latch clock signal CKS goes high. Otherwise, with $CB_{REG}$ set at "1", flip flop 76.1 is in the storage mode and passes the D input signal stored in latch 81 to latch 82 when clock signal CKS goes high.

When $CB_{REG}$ is not set, transistor 83 is turned off and transistor 86 directs the signal on input line 79 of multiplexer 76 through an inverter to the input terminal of slave latch 82, or transistor 87 directs the signal on input line 80 through an inverter to the input terminal of slave latch 82. In the embodiment of FIG. 4, this feature gives the user the added flexibility of not latching data into flip flop 47 during the cascade mode, while using the redirectable product term line 42 to pass signals to output line 65.

While the present invention is illustrated with particular embodiments, it includes all variations and modifications of the disclosed embodiments falling within the scope of the appended claims. In particular, the redirectable line used for the flip flop reset operation in the non-cascaded mode may instead serve as a flip flop set line, output enable line, or provide some signal other than those that feed OR gate 41 of FIG. 4.

We claim:

1. A structure for a programmable logic circuit comprising:

a plurality of macrocells each having:
product term input signals;
a dedicated product term input signal;
a logic gate which receives at least the product term input signals and signals from a plurality of macrocells including from other than adjacent macrocells, and generates an output signal therefrom;
a flip flop having an input terminal;
a multiplexer having a first state and a second state, wherein the first state directs the output signal to the flip flop input terminal and the second state directs the dedicated product term input signal to the flip flop input terminal.

2. The structure of claim 1, wherein the output signal is cascaded through a plurality of other macrocells.

3. The structure of claim 1, wherein the flip flop is a D flip flop.

4. The structure of claim 3, wherein in the first state, the dedicated product term input signal is directed to a reset terminal of the D flip flop.

5. The structure of claim 1, wherein said output signal and said another signal are the only sources of signals to said input terminal of said flip flop.

6. A method for directing signals in a programmable logic circuit, comprising:

coupling a plurality of product term input signals to the input terminals of a logic gate in a first macrocell, wherein the logic gate generates an output signal;

coupling a dedicated product term input signal to an input terminal of the first macrocell;

in a first state, directing the output signal to a memory element within the first macrocell; and in a second state, directing the output signal to a macrocell within the logic circuit but different from the first macrocell, and directing the dedicated product term input signal to the memory element within the first macrocell.

7. The method of claim 6, wherein in the second state, macrocells within the logic circuit but different from the first macrocell, include macrocells not adjacent to the first macrocell.

* * * * *

UNITED STATES PATENT AND TRADEMARK OFFICE
CERTIFICATE OF CORRECTION

PATENT NO. : 5,565,792
DATED : October 15, 1996
INVENTOR(S) : David Chiang, Napoleon W. Lee, David A. Harrison, Nicholas Kucharewski, Jr. and Jeffrey H. Seltzer It is certified that error appears in the above-identified patent and that said Letters Patent is hereby corrected as shown below:

Col. 1, line 5, please delete "now abandoned" and insert --now Pat. No. 5,357,153--.

Signed and Sealed this

Twentieth Day of January, 1998

Attest:

BRUCE LEHMAN

*Attesting Officer*       *Commissioner of Patents and Trademarks*